United States Patent
Lee

(10) Patent No.: US 6,664,170 B1
(45) Date of Patent: Dec. 16, 2003

(54) METHOD FOR FORMING DEVICE ISOLATION LAYER OF A SEMICONDUCTOR DEVICE

(75) Inventor: Won-kwon Lee, Chungju (KR)

(73) Assignee: Hynix Semiconductor, Inc., Gyunggi-do (KR)

( * ) Notice: Subject to any disclaimer, the term of this patent is extended or adjusted under 35 U.S.C. 154(b) by 0 days.

(21) Appl. No.: 10/341,173

(22) Filed: Jan. 13, 2003

(30) Foreign Application Priority Data

Jul. 10, 2002 (KR) .................... 10-2002-40089

(51) Int. Cl.⁷ .............................................. H01L 21/76
(52) U.S. Cl. .................... 438/424; 438/425; 438/431
(58) Field of Search ............................. 438/424, 425, 438/430, 431

(56) References Cited

U.S. PATENT DOCUMENTS

| | | | |
|---|---|---|---|
| 3,997,367 A | * 12/1976 | Yau | 438/374 |
| 5,960,298 A | * 9/1999 | Kim | 438/424 |
| 5,966,615 A | * 10/1999 | Fazan et al. | 438/424 |
| 6,183,937 B1 | * 2/2001 | Tsai et al. | 430/313 |
| 6,207,541 B1 | * 3/2001 | Das et al. | 438/585 |
| 6,372,604 B1 | * 4/2002 | Sakai et al. | 438/425 |

OTHER PUBLICATIONS

Davari et al., "A new planarizatoin technique, using a combination of RIE and chemical Mechanical polish (CMP)," *International Electron Devices Meeting, Technical Digest (IEEE)*, pp. 61–64, (Dec. 3–6, 1989).

Fazan et al., "A highly manufacturable trench isolation process for deep submicron DRAMs," *International Electron Devices Meeting, Technical Digest (IEEE)*, pp. 57–60, (Dec. 5–8, 1993).

* cited by examiner

Primary Examiner—T. N. Quach
(74) Attorney, Agent, or Firm—Marshall, Gerstein & Borun LLP

(57) ABSTRACT

The present disclosure relates to a method for forming a device isolation layer of a semiconductor device by a shallow trench isolation (STI). In the disclosed methods, after a nitride layer is removed from the silicon substrate, an amorphous silicon layer is deposited thereon and is oxidized to form an amorphous spacer at a side wall of the device isolation layer by etching the amorphous silicon layer.

7 Claims, 4 Drawing Sheets

METHOD FOR FORMING DEVICE ISOLATION LAYER OF A SEMICONDUCTOR DEVICE

BACKGROUND

1. Technical Field

The present disclosure relates to a method for forming a device isolation layer of a semiconductor device, and more particularly, to a method for forming a device isolation layer of a semiconductor device capable of suppressing a hump and an electric field concentration effect by preventing the generation of a remote effect at an edge of the device isolation layer wherein the profile of the device isolation layer is implanted in a silicon substrate by a shallow trench isolation (STI) process.

2. Description of the Related Art

Generally, in order to fabricate devices such as a transistor, a capacitor or the like in a silicon substrate, an isolation region is formed to prevent the device from electrically connecting to an active area capable of flowing an electric current and isolate the devices from each other.

Thus, recently a shallow trench isolation (STI) process has been widely used for forming a device isolation region in a semiconductor device. The STI region is generally formed as follows; a trench having a predetermined depth is formed on the silicon substrate; an oxide layer is deposited onto the trench; and an undesired portion of the oxide layer is etched by using a chemical mechanical polishing (CMP) process.

FIGS. 1a–1d are cross-sectional views sequentially showing a method for forming a device isolation layer of a semiconductor device in accordance with a prior art method. FIG. 2 is a cross-sectional view showing shortcomings of a device isolation layer formed in accordance with a conventional manufacturing method.

As shown in FIG. 1a, a pad oxide layer 2 is formed on a silicon substrate 1 with a predetermined thickness to insulate and a nitride layer 3 is formed on the pad oxide layer 2 to protect between an upper and a lower layer.

At this time, the nitride layer 3 can be used as an etching mask during the trench etching process or can be used for an etching stop layer during a later CMP process.

After a photoresist layer is coated on top of the nitride layer 3, the photoresist layer is patterned into a photoresist pattern (not shown) by a lithography process, a device isolation region is exposed on the silicon substrate 1 by etching the nitride layer 3 and the pad oxide layer 2 using the photoresist pattern as a mask sequentially.

Then, after removing the photoresist pattern (not shown), a trench 4 is formed in the silicon substrate 1 by performing a dry etching using the nitride layer 3 as an etching mask.

Thereafter, as shown in FIG. 1b, a gap filling oxide layer 5 is deposited on the resultant structure by using a chemical vapor deposition method, at this time, a step is formed in the gap filling oxide layer 5 deposited between the device isolation region and the active region due to the trench formed in the silicon substrate 1.

As shown in FIG. 1c, the step between the device isolation region and the active region is alleviated by partially etching the gap filling oxide layer 5 in the active region by depositing a photoresist layer 6 on the top of the gap filling oxide layer 5 of the device isolation region.

As shown in FIG. 1d, after the resultant structure is planarized by grinding the structure onto a top of a nitride layer (not shown) by a chemical mechanical polishing process, the device isolation layer is formed by removing the nitride layer (not shown).

However, if the conventional method for forming the device isolation layer as described above is utilized, since a dry etching is performed by the photoresist pattern as a mask to reduce the step between the device isolation region and the active region, the position of the photoresist pattern becomes misaligned, resulting in damage to the active region by etching the active region as shown in FIG. 2, which, in turn, deteriorates the characteristics and reliability of the semiconductor device.

In addition, during the removal of the nitride layer, an over etching is performed to completely remove the nitride layer. At this time, an electrical fringing field generates an edge portion of the device isolation layer during the operation of the device by forming a moat at an edge portion of the device isolation layer with etching the gap filling oxide layer and the nitride layer at a different etching ratio. Consequently, the device deteriorates in electrical as well as a threshold voltage when changed by the hump.

SUMMARY OF THE DISCLOSURE

The disclosure provides a method for forming a device isolation layer of a semiconductor device capable of preventing loss of an active region due to a misalignment of a photoresist pattern by alleviating a step between the active region and the device isolation region by using a photoresist layer containing silicon during a line etching of the active region for alleviating the step between the active region and the device isolation region when a gap filling oxide layer is planarized by a shallow trench isolation (STI) process.

A method for forming a device isolation layer of a semiconductor device in accordance with the disclosure comprises the steps of: providing a silicon substrate having a substructure of a predetermined configuration; depositing a nitride layer on a top of the silicon substrate; forming a trench on a device isolation region of the silicon substrate; depositing a gap filling oxide layer on the trench and a portion of the silicon substrate which does not form the trench; forming a photoresist pattern on the gap filling oxide layer of the device isolation region; oxidizing the photoresist pattern by performing a first oxidation process; removing a portion of the gap filling oxide layer by using the oxidized photoresist pattern as a mask to form a first intermediate structure; planarizing the first intermediate structure to a top of the nitride layer by using a chemical mechanical polishing process; removing the nitride layer to form a second intermediate structure; forming an amorphous silicon layer on top of the second intermediate structure; etching the front of the amorphous silicon layer to form an amorphous silicon spacer on a side wall of an extruded field oxide layer; and oxidizing the spacer by performing a second oxidation process.

The photoresist pattern containing 7% silicon to 50% silicon is deposited at a thickness of 500 Å to 15000 Å. The oxidation process for oxidizing the surface of the photoresist pattern is performed by plasma ashing using $O_2$ plasma at a temperature ranging from 50° C. to 200° C. or an ion implantation method for implanting $O_2$ ions in order to prevent damage to the active region due to misalignment of the photoresist pattern.

The amorphous silicon layer is formed at a thickness ranging from 300 Å to 700 Å at a temperature of 400° C. to 600° C. by using a low chemical vapor deposition method. The spacer is oxidized by $O_2$ plasma treatment at a temperature of 200° C. to 800° C. to increase the width of the gap filling oxide layer on the upper portion of the active region and prevent the moat phenomenon.

BRIEF DESCRIPTION OF DRAWINGS

The above and other features of the disclosed method will become apparent from the following description of preferred embodiments with reference to the accompanying drawings in which.

DETAILED DESCRIPTION OF THE PRESENTLY PREFERRED EMBODIMENTS

FIGS. 3a–3h show cross-sectional views sequentially illustrating a method for forming a device isolation layer of a semiconductor in accordance with the present disclosure.

Figure 1A:
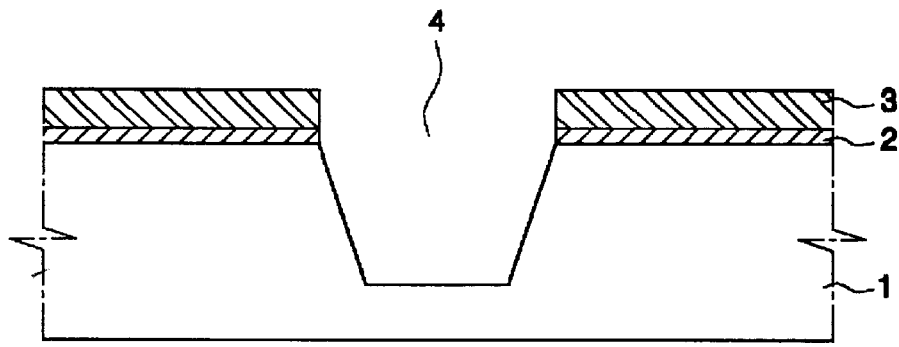
FIGS. 1a–1d are cross-sectional views sequentially showing a method for forming a device isolation layer of a semiconductor device in accordance with a prior art.
Figure 1B:
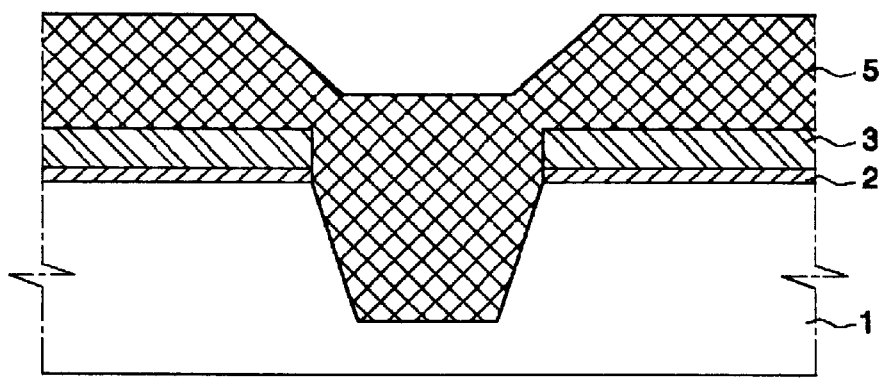
Figure 1C:
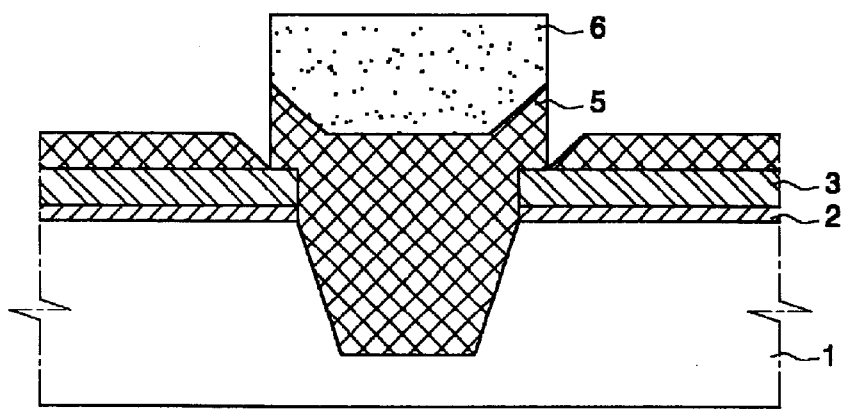
Figure 1D:
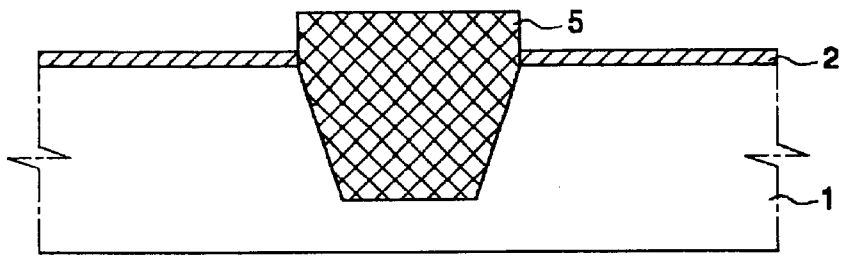
Figure 2:
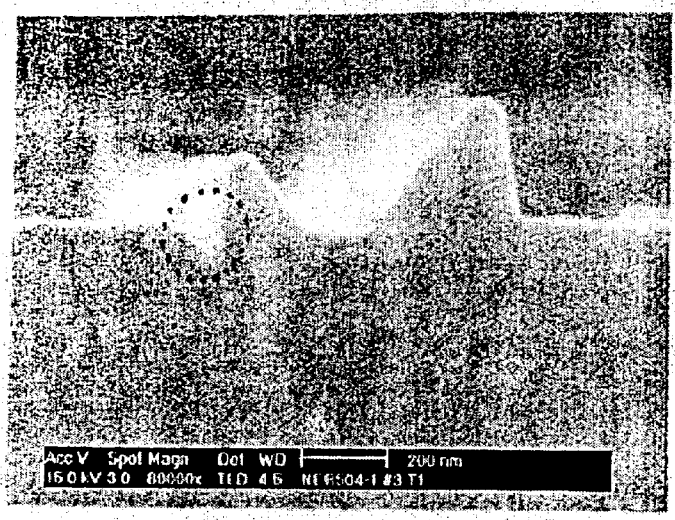
FIG. 2 is a cross-sectional view showing shortcomings of a device isolation layer formed in accordance with a conventional manufacturing method.
Figure 3A:
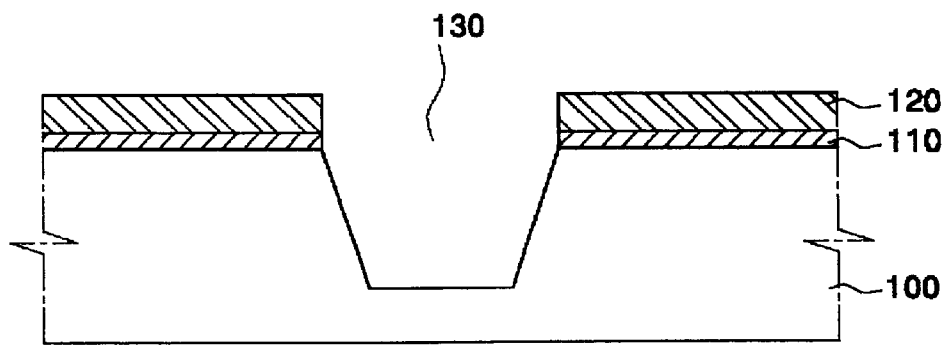
FIGS. 3a–3h show cross-sectional views sequentially illustrating a method for forming a device isolation layer of a semiconductor in accordance with the present disclosure.

As shown in FIG. 3a, after a silicon substrate 100 provided with a substructure of a predetermined configuration is prepared, a pad oxide layer 110 and a nitride layer 120 are deposited on the silicon substrate 100 sequentially. Thereafter, a photoresist pattern (not shown) to form a trench 130 is formed on the nitride layer 120 and the trench 130 is formed in the silicon substrate 100 by dry etching the nitride layer 120, the pad oxide layer 110 and the silicon substrate 100 by using the photoresist pattern as a mask and using $Cl_2$, HBr, $O_2$ and $N_2$ gas as an etching gas.

The nitride layer 120 is deposited at a thickness ranging from 1000 Å to 1500 Å and may be utilized as an etching mask during an additional trench etching process or as an etching stop layer during a later process such as a chemical mechanical polishing process.

Figure 3B:
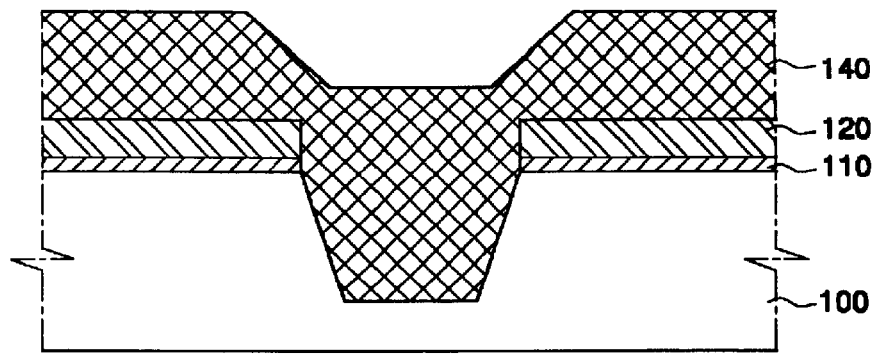

In an ensuing step, as shown in FIG. 3b, a gap filling oxide layer 140 is deposited on the resultant structure. At this time, a step is formed on portions of the gap filling oxide layer 140 deposited on the device isolation region and the active region by the trench 130 formed in the silicon substrate 100.

Figure 3C:
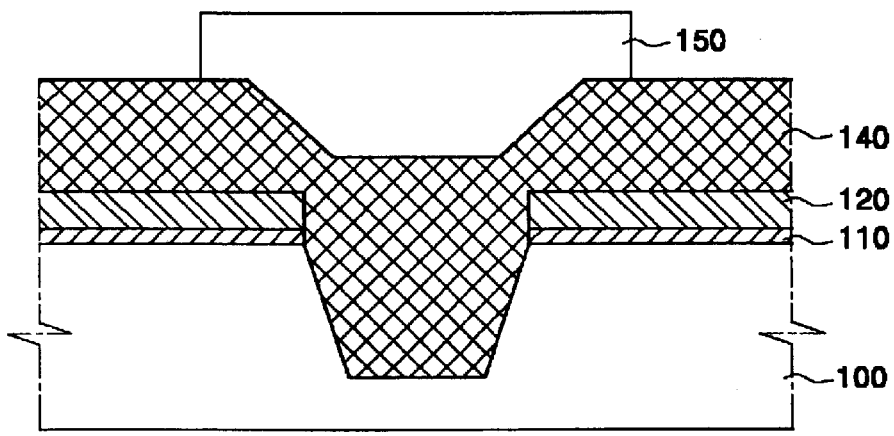
Figure 3D:
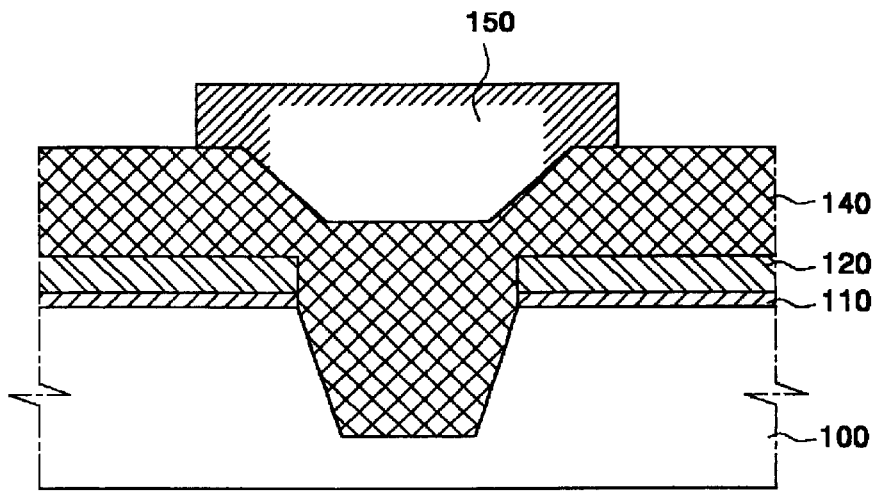

In the next step, as shown in FIG. 3c, a photoresist pattern 150 is formed on a top of the device isolation region by depositing a photoresist layer containing 7% silicon to 15% silicon on a top of the gap filling oxide layer 140 of the device isolation region at a thickness of 5000 Å to 15000 Å. Subsequently, as shown in FIG. 3d, a surface of the photoresist pattern 150 is oxidized by a plasma ashing method using $O_2$ plasma at a temperature ranging from 50° C. to 200° C. or an ion implantation method for implanting $O_2$ ions.

Figure 3E:
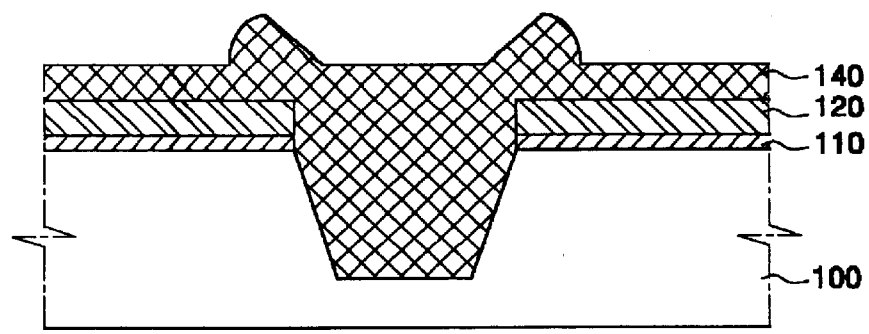

And, as shown in FIG. 3e, the step between the device isolation region and the active region is alleviated by partially etching the gap filling oxide layer 140 of the active region without damaging the active region due to misalignment of the photoresist pattern 150 caused by utilizing the oxidized photoresist pattern 150 as a mask.

Figure 3F:
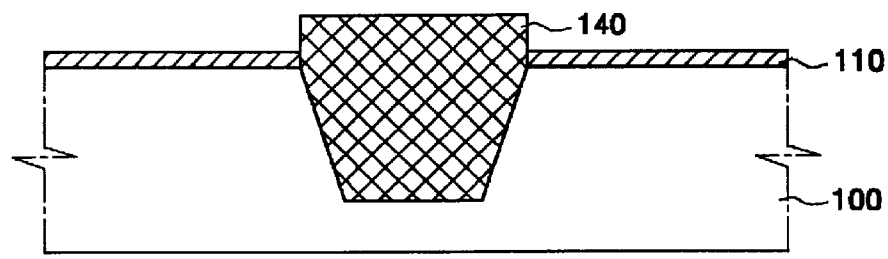

Thereafter, as shown in FIG. 3f, after the step between the device isolation region and the active region is removed by a chemical mechanical polishing the gap filling oxide layer 140 in such a way that the nitride layer (not shown) as an etching stop layer remains at a thickness of 400 Å to 800 Å, the nitride layer (riot shown) is removed by using a phosphoric acid ($H_3PO_4$) solution.

Figure 3G:
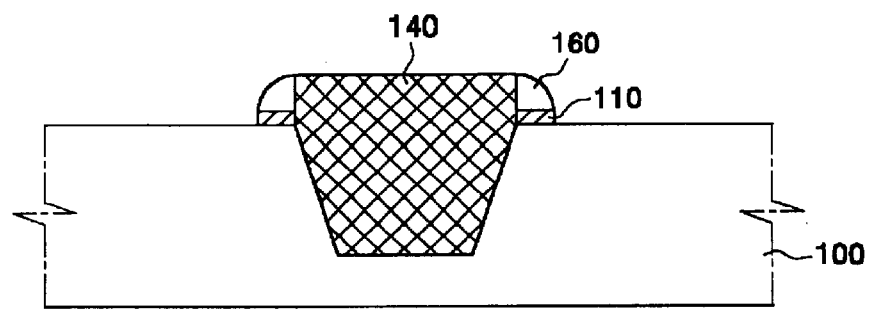

Then, as shown in FIG. 3g, after an amorphous silicon layer (not shown) is formed on the resultant structure at a thickness of 300 Å to 700 Å at a temperature ranging from 400° C. to 600° C. using a low pressure chemical vapor deposition method, an amorphous silicon spacer 160 is formed at a side wall of the extruded gap filling oxide layer by etching the front side of the amorphous silicon layer (riot shown) and the pad oxide layer 110.

Figure 3H:
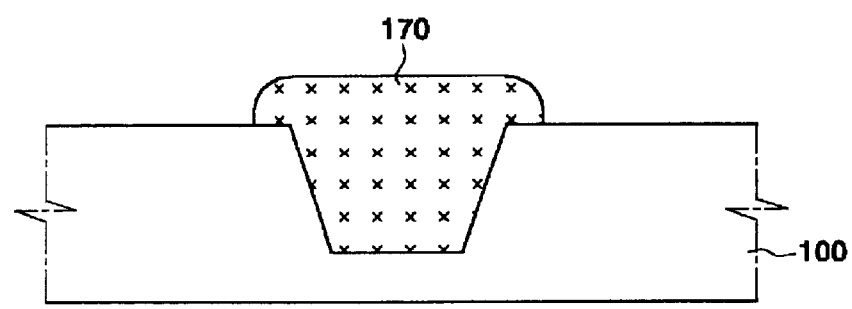

Also, as shown in FIG. 3h, a device isolation layer 170 is formed by oxidizing the amorphous silicon spacer 160 by processing the amorphous silicon spacer in $O_2$ plasma at a temperature ranging from 200° C. to 800° C.

Accordingly, as described above, a method for forming a device isolation layer of a semiconductor device in accordance with the present disclosure, involves formation of a device isolation layer by a shallow trench isolation (STI). After a nitride layer is removed from the silicon substrate, an amorphous silicon layer is deposited thereon, and is oxidized to form an amorphous spacer at a side wall of the device isolation layer by etching the stacked amorphous silicon layer. The present method can prevent a moat effect by being over etched at both edges of the device isolation layer, thereby improving the characteristics of the semiconductor device and the reliability thereof, as well as allowing for high integration of the semiconductor device.

While the disclosed methods for forming a device isolation layer of a semiconductor device have been described with respect to the preferred embodiments, other modifications and variations may be made without departing from the spirit and scope of the present disclosure as set forth in the following claims.

What is claimed is:

1. A method for forming a device isolation layer of a semiconductor device, comprising the steps of:

providing a silicon substrate having a substructure of a predetermined configuration;

depositing a nitride layer on a top of the silicon substrate;

forming a trench on a device isolation region of the silicon substrate;

depositing a gap filling oxide layer on the trench and a portion of the silicon substrate which does not form the trench;

forming a photoresist pattern on the gap filling oxide layer of the device isolation region;

oxidizing the photoresist pattern by performing a first oxidation process;

removing a portion of the gap filling oxide layer by using the oxidized photoresist pattern as a mask to form a first intermediate structure;

planarizing the first intermediate structure to a top of the nitride layer by using a chemical mechanical polishing process;

removing the nitride layer to form a second intermediate structure;

forming an amorphous silicon layer on a top of the second intermediate structure;

etching a front of the amorphous silicon layer to form an amorphous silicon spacer on a side wall of an extruded field oxide layer; and oxidizing the spacer by performing a second oxidation process.

2. The method of claim 1, wherein the photoresist pattern contains 7% silicon to 50% silicon.

3. The method of claim 2, wherein the photoresist pattern is formed at a thickness ranging from 5000 Å to 15000 Å.

4. The method of claim 1, wherein the first oxidation process is selected from the group consisting of plasma ashing using $O_2$ plasma at a temperature ranging from 50° C. tc 200° C. and ion implantation.

5. The method of claim 1, wherein the photoresist pattern is formed in a thickness ranging from 5000 Å to 15000 Å.

6. The method of claim 1, wherein the amorphous silicon layer is formed at a thickness ranging from 300 Å to 700 Å at a temperature of 400° C. to 600° C. by chemical vapor deposition.

7. The method of claim 1, wherein the second oxidation process comprises an $O_2$ plasma process at a temperature ranging from 200° C. to 800° C.

* * * * *

UNITED STATES PATENT AND TRADEMARK OFFICE
CERTIFICATE OF CORRECTION

PATENT NO.    : 6,664,170 B1   Page 1 of 1
DATED         : December 16, 2003
INVENTOR(S)   : Won-Kwon Lee It is certified that error appears in the above-identified patent and that said Letters Patent is hereby corrected as shown below:

<u>Title page,</u>
Item [75], Inventor, please change "Chungju (KR)" and replace with
-- Chungcheongbuk-do (KR) --.

Signed and Sealed this

Thirtieth Day of March, 2004

JON W. DUDAS
*Acting Director of the United States Patent and Trademark Office*